United States Patent
Chen et al.

(10) Patent No.: US 12,068,466 B2
(45) Date of Patent: Aug. 20, 2024

(54) BATTERY HEATING SYSTEM AND METHOD, POWER SUPPLY SYSTEM, AND ELECTRICAL APPARATUS

(71) Applicant: CONTEMPORARY AMPEREX TECHNOLOGY CO., LIMITED, Ningde (CN)

(72) Inventors: Xinwei Chen, Ningde (CN); Yu Yan, Ningde (CN); Zhimin Dan, Ningde (CN); Zhanliang Li, Ningde (CN); Yizhen Hou, Ningde (CN); Wei Zhang, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 18/450,375

(22) Filed: Aug. 15, 2023

(65) Prior Publication Data
US 2023/0387492 A1    Nov. 30, 2023

Related U.S. Application Data

(63) Continuation of application No. PCT/CN2021/143908, filed on Dec. 31, 2021.

(51) Int. Cl.
*H01M 10/615* (2014.01)
*G01R 31/36* (2020.01)
*G01R 31/367* (2019.01)
*H01M 10/633* (2014.01)

(52) U.S. Cl.
CPC ...... *H01M 10/615* (2015.04); *G01R 31/3648* (2013.01); *G01R 31/367* (2019.01); *H01M 10/633* (2015.04); *H01M 2220/20* (2013.01)

(58) Field of Classification Search
CPC ............. H01M 10/615; H01M 10/633; H01M 2220/20; H01M 10/42; H01M 10/48; H01M 10/625; H01M 10/4207; H01M 10/486; H01M 2220/30; G01R 31/3648; G01R 31/367; Y02E 60/10
See application file for complete search history.

(56) References Cited

U.S. PATENT DOCUMENTS

| | | | |
|---|---|---|---|
| 2014/0285135 A1 | 9/2014 | Ji et al. | |
| 2016/0178703 A1* | 6/2016 | Hwang | G01R 31/392 702/63 |
| 2021/0313634 A1* | 10/2021 | Zhamu | H01M 50/284 |
| 2022/0263144 A1* | 8/2022 | Xie | H01M 10/425 |
| 2022/0271358 A1* | 8/2022 | Qin | H01M 10/637 |

FOREIGN PATENT DOCUMENTS

| | | |
|---|---|---|
| CN | 109301366 A | 2/2019 |
| CN | 109904540 A | 6/2019 |
| CN | 111029667 A | 4/2020 |
| CN | 112151915 A | 12/2020 |
| CN | 113809765 A | 12/2021 |
| JP | 2019117685 A | 7/2019 |
| JP | 2019180124 A | 10/2019 |
| WO | 2016111106 A1 | 7/2016 |

OTHER PUBLICATIONS

The World Intellectual Property Organization (WIPO) International Search Report and Written Opinion for PCT/CN2021/143908 Sep. 27, 2022 10 pages (with translation).
The Japan Patent Office (JPO) Notification of Reasons for Refusal for Application No. 2023-547524 and Translation Mar. 5, 2024 9 Pages.

* cited by examiner

*Primary Examiner* — Muhammad S Siddiquee
(74) *Attorney, Agent, or Firm* — ANOVA LAW GROUP, PLLC

(57) ABSTRACT

A battery heating system includes a voltage conversion unit configured to be electrically connected to a power source and to a battery to be heated, and a control unit. The voltage conversion unit receives a first voltage input by the power source or a second voltage input by the battery to be heated. The control unit acquires a charging and discharging frequency of the voltage conversion unit, determines a charge transfer impedance of the battery to be heated according to the charging and discharging frequency, calculates a safe amplitude current of the battery to be heated according to the charge transfer impedance, and sends a control signal to the voltage conversion unit according to the charging and discharging frequency and the safe amplitude current to cause the voltage conversion unit to perform boost or buck processing of the first voltage or the second voltage according to the control signal.

18 Claims, 9 Drawing Sheets

BATTERY HEATING SYSTEM AND METHOD, POWER SUPPLY SYSTEM, AND ELECTRICAL APPARATUS

CROSS-REFERENCE TO RELATED APPLICATION

This application is a continuation if International Application No. PCT/CN2021/143908, filed on Dec. 31, 2021, the entire content of which is incorporated herein by reference.

TECHNICAL FIELD

The present application relates to the field of batteries, and specifically to a battery heating system and method, a power supply system, and an electrical apparatus.

BACKGROUND

Energy saving and emission reduction are the key to the sustainable development of automobile industry, and electric vehicles have become an important part of the sustainable development of automotive industry due to their advantages of energy saving and environmental protection. For electric vehicles, battery technology is an important factor related to their development.

With the widespread use of batteries, how to improve battery performance has become an issue of increasing urgency in the development of battery technologies. The inventors of the present application found that the temperature has a particularly serious impact on the battery performance, especially in low-temperature situations, the available capacity of the battery will be significantly attenuated, which will lead to the occurrence of the situation where the battery can neither be discharged nor charged in low-temperature conditions, thus seriously restricting the performance of the battery.

SUMMARY

Embodiments of the present application propose a battery heating system and method, a power supply system, and an electrical apparatus to solve the above-mentioned problems in the related art.

On the one hand, embodiments of the present application propose a battery heating system, comprising: a voltage conversion unit that is electrically connected separately to a power source and to a battery to be heated to receive a first voltage input by the power source or a second voltage input by the battery to be heated; and a control unit for acquiring a charging and discharging frequency of the voltage conversion unit, determining a charge transfer impedance of the battery to be heated according to the charging and discharging frequency, calculating a safe amplitude current of the battery to be heated according to the charge transfer impedance, and sending a control signal to the voltage conversion unit according to the charging and discharging frequency and the safe amplitude current to cause the voltage conversion unit to perform boost or buck processing of the first voltage or the second voltage according to the control signal.

In the above embodiment of the present application, by determining the safe amplitude current according to the charging and discharging frequency of the voltage conversion unit and the charge transfer impedance, and sending the control signal to the voltage conversion unit according to the charging and discharging frequency and the safe amplitude current to cause the voltage conversion unit to perform boost or buck processing of the first voltage or the second voltage according to the control signal, the effect of heating of the battery is greatly improved and the efficiency of heating is increased.

In some embodiments, a temperature monitoring unit is included, wherein the temperature monitoring unit is used for monitoring the temperature of the battery to be heated and sending the temperature to the control unit; and the control unit determines the charge transfer impedance of the battery to be heated according to the temperature as well as the charging and discharging frequency of the voltage conversion unit.

In this way, it is possible to monitor the state of the battery to be heated in real time and to correct the charging and discharging voltage, so that the battery to be heated is always in an optimal effect of heating, thus greatly improving the efficiency of heating.

In some embodiments, the control unit is further used for determining the charge transfer impedance of the battery to be heated according to the state of charge of the battery to be heated, the temperature, and the charging and discharging frequency; and the control unit is further used for calculating the safe amplitude current of the battery to be heated according to a lithium plating potential of the battery to be heated and the charge transfer impedance.

In embodiments of the present application, the safe amplitude current is acquired according to the equilibrium potential of the graphite negative electrode and the charge transfer impedance without relying on the charging cut-off voltage and open-circuit voltage set by the manufacturer, which enables the true state of the battery to be charged to be reflected to the greatest extent and breaks through the limitation of the cut-off voltage set by the manufacturer, thus greatly improving the efficiency of heating.

In some embodiments, the control unit pre-stores a state of charge of the battery to be heated, a temperature, a charging and discharging frequency, and a safe amplitude current mapping table; and the control unit is further used for determining a safe amplitude current of the battery to be heated in its current state by searching in the safe amplitude current mapping table according to the state of charge of the battery to be heated, the temperature, and the charging and discharging frequency.

By setting the mapping table of the state of charge, the temperature, the charging and discharging frequency, and the safe amplitude current for the battery to be heated, the safe amplitude current for charging and discharging can be quickly acquired, thus improving the efficiency of heating.

In some embodiments, the voltage conversion unit is used for performing boost or buck processing of the first voltage or the second voltage in a first time period so that a charging current received by the battery to be heated is less than the safe amplitude current.

In some embodiments, the voltage conversion unit is used for performing boost or buck processing of the first voltage or the second voltage in a second time period so that a discharging current output from the battery to be heated is less than the safe amplitude current.

In some embodiments, the control unit is further used for sending a control signal to the voltage conversion unit when the temperature is less than a first preset threshold; and stopping outputting the control signal when the temperature is greater than or equal to the first preset threshold.

By monitoring the temperature of the battery to be heated in real time, the heating process can be controlled in time according to the condition of the battery to be heated, and when the effect of heating is not good, the heating process can be terminated in time to save energy.

In some embodiments, the system comprises an external heating source, wherein the control unit is used for starting the external heating source to heat the battery to be heated when the temperature is less than a second preset threshold; and turning off the external heating source when the temperature is greater than or equal to the second preset threshold, the first preset threshold being less than the second preset threshold.

By combining the rapid heating mode with a mode of heating with a conventional external heating source, the effect of heating the battery to be heated is improved and the efficiency of heating is increased.

On the other hand, embodiments of the present application further propose a battery heating method, in which a battery to be heated is electrically connected to a power source through a voltage conversion unit, wherein the method comprises: acquiring a charging and discharging frequency of the voltage conversion unit; determining a charge transfer impedance of the battery to be heated according to the charging and discharging frequency; calculating a safe amplitude current of the battery to be heated according to the charge transfer impedance; and sending a control signal to the voltage conversion unit according to the safe amplitude current and the charging and discharging frequency, so that the voltage conversion unit regulates a first voltage input by the battery to be heated or a second voltage input by the power source according to the control signal.

In the above embodiment of the present application, by determining the safe amplitude current according to the charging and discharging frequency of the voltage conversion unit and the charge transfer impedance, and sending the control signal to the voltage conversion unit according to the charging and discharging frequency and the safe amplitude current to cause the voltage conversion unit to perform boost or buck processing of the first voltage or the second voltage according to the control signal, the effect of heating of the battery is greatly improved and the efficiency of heating is increased.

In some embodiments, said determining the charge transfer impedance of the battery to be heated according to the charging and discharging frequency comprises: acquiring the temperature of the battery to be heated, and determining the charge transfer impedance of the battery to be heated according to the temperature and the charging and discharging frequency.

In this way, it is possible to monitor the state of the battery to be heated in real time and to correct the charging and discharging voltage, so that the battery to be heated is always in an optimal effect of heating, thus greatly improving the efficiency of heating.

In some embodiments, said determining the charge transfer impedance of the battery to be heated according to the charging and discharging frequency comprises: determining the charge transfer impedance of the battery to be heated according to the state of charge of the battery to be heated, the temperature, and the charging and discharging frequency; and said calculating a safe amplitude current of the battery to be heated according to the charge transfer impedance comprises: calculating the safe amplitude current of the battery to be heated according to a lithium plating potential of the battery to be heated and the charge transfer impedance.

In embodiments of the present application, the safe amplitude current is acquired according to the equilibrium potential of the graphite negative electrode and the charge transfer impedance without relying on the charging cut-off voltage and open-circuit voltage set by the manufacturer, which enables the true state of the battery to be charged to be reflected to the greatest extent and breaks through the limitation of the cut-off voltage set by the manufacturer, thus greatly improving the efficiency of heating.

In some embodiments, said calculating a safe amplitude current of the battery to be heated according to the charge transfer impedance comprises: pre-storing a state of charge of the battery to be heated, a temperature, a charging and discharging frequency, and a safe amplitude current mapping table; and determining a safe amplitude current of the battery to be heated in its current state by searching in the safe amplitude current mapping table according to the state of charge of the battery to be heated, the temperature, and the charging and discharging frequency.

By setting the mapping table of the state of charge, the temperature, the charging and discharging frequency, and the safe amplitude current for the battery to be heated, the safe amplitude current for charging and discharging can be quickly acquired, thus improving the efficiency of heating.

In some embodiments, said regulating a first voltage input by the battery to be heated or a second voltage input by the power source according to the control signal comprises: performing boost or buck processing of the first voltage or the second voltage in a first time period so that a charging current received by the battery to be heated is less than the safe amplitude current.

In some embodiments, said regulating a first voltage input by the battery to be heated or a second voltage input by the power source according to the control signal comprises: performing boost or buck processing of the first voltage or the second voltage in a second time period so that a discharging current output from the battery to be heated is less than the safe amplitude current.

In some embodiments, the method further comprises: regulating the first voltage input by the battery to be heated or the second voltage input by the power source when the temperature is less than a first preset threshold; and stopping regulating the first voltage input by the battery to be heated or the second voltage input by the power source when the temperature is greater than or equal to the first preset threshold.

By monitoring the temperature of the battery to be heated in real time, the heating process can be controlled in time according to the condition of the battery to be heated, and when the effect of heating is not good, the heating process can be terminated in time to save energy.

In some embodiments, the method further comprises: starting an external heating source to heat the battery to be heated when the temperature is less than a second preset threshold; and turning off the external heating source when the temperature is greater than or equal to the second preset threshold, the first preset threshold being less than the second preset threshold.

By combining the rapid heating mode with a mode of heating with a conventional external heating source, the effect of heating the battery to be heated is improved and the efficiency of heating is increased.

Another aspect of embodiments of the present application further proposes a power supply system, comprising the battery heating system proposed in the above embodiments, wherein the battery heating system is used for heating a battery to be heated, and the battery to be heated is used for providing a power source.

Another aspect of embodiments of the present application further proposes an electrical apparatus, comprising the power supply system described above, wherein the power supply system is used for providing a power source.

The above description is only a summary of the technical solutions of the present invention. In order to be able to understand the technical means of the present invention more clearly, the technical means can be implemented according to the content of the specification. Furthermore, in order to make the above and other objectives, features and advantages of the present invention more comprehensible, specific implementations of the present invention are exemplified below.

BRIEF DESCRIPTION OF DRAWINGS

The drawings described herein are intended to provide a further understanding of the present application, which constitute a part of the present application. The illustrative embodiments of the present application and the description thereof are for explaining the present application and do not constitute an undue limitation of the present application. In the accompanying drawings.

DETAILED DESCRIPTION

Figure 1:
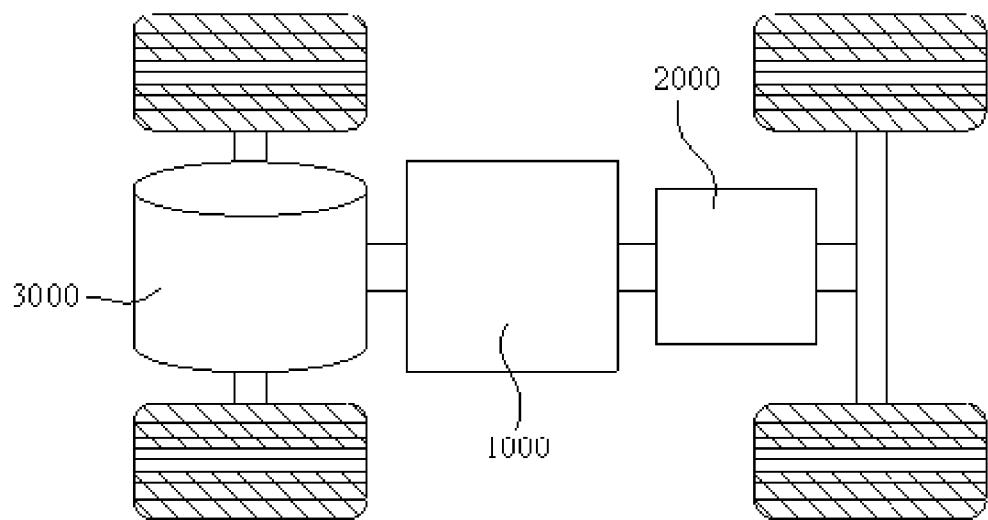
FIG. 1 illustrates a schematic diagram of an electrical apparatus proposed in embodiments of the present application.

To make the objective, technical solutions and advantages of the embodiments of the present application more clear, the technical solutions in the embodiments of the present application will be clearly described below with reference to the drawings in the embodiments of the present application. Obviously, the embodiments described are some of rather than all of the embodiments of the present application. Based on the embodiments in the present application, all other embodiments obtained by those of ordinary skill in the art without creative effort fall within the protection scope of the present application.

Unless otherwise defined, all technical and scientific terms used in the present application have the same meanings as those commonly understood by those skilled in the art to which the present application belongs. The terms used in the specification of the present application are merely for the purpose of describing specific embodiments, but are not intended to limit the present application. The terms "comprising" and "having" and any variations thereof in the specification and the claims of the present application as well as the foregoing description of the drawings are intended to cover non-exclusive inclusions. The terms "first", "second", etc., in the specification and claims of the present application or in the accompanying drawings above are used to distinguish between different objects and are not intended to describe a particular order or relationship of precedence.

Reference to "an embodiment" in the present application means that a particular feature, structure, or characteristic described in connection with the embodiment can be included in at least one embodiment of the present application. The appearance of this phrase in various places in the specification does not necessarily refer to the same embodiment, nor is it a separate or alternative embodiment that is mutually exclusive with other embodiments. It is understood explicitly and implicitly by those skilled in the art that the embodiments described in the present application can be combined with other embodiments.

In the description of the present application, it should be noted that the terms "mounting", "connecting", "connection" and "attachment" should be understood in a broad sense, unless otherwise explicitly specified or defined. For example, it may be a fixed connection, a detachable connection, or an integrated connection; and it may be a direct connection or an indirect connection through an intermediate medium, or may be a communication between the interior of two elements. For those of ordinary skill in the art, the specific meanings of the above terms in the present application can be understood according to specific situations.

In the present application, the term "and/or" is only an association relationship for describing associated objects, indicating that three relationships may exist. For example, A and/or B may represent three situations: A exists, both A and B exist, and B exists. In addition, the character "|" in the present application generally means that the associated objects before and after it are in an "or" relationship.

In the present application, "a plurality of" means two or more (including two); similarly, "a plurality of groups" means two or more groups (including two groups), and "a plurality of sheets" means two or more sheets (including two sheets).

In the present application, the battery cell may comprise a lithium-ion secondary battery, a lithium-ion primary battery, a lithium-sulfur battery, a sodium-lithium-ion battery, a sodium-ion battery, a magnesium-ion battery, or the like, which is not limited in the embodiments of the present application. The battery cell may be cylindrical, flat, rectangular, or in other shapes, which is also not limited in the embodiments of the present application. The battery cells are generally divided into three types according to encapsulating manners: cylindrical battery cells, prismatic rectangular battery cells, and pouch cells, which are not limited in the embodiments of the present application.

Currently, with the development of technology, power batteries are being used more and more widely. The power batteries are not only applied in energy storage power source systems such as hydraulic, thermal, wind and solar power stations but also wildly applied in electric vehicles such as electric bicycles, electric motorcycles and electric cars, as well as multiple fields such as military equipment and aerospace fields. With the continuous expansion of the application field of the power batteries, the market demand is also constantly expanding.

The inventors of the present application note that in an existing electrical apparatus using the battery technology as the power source, such as an electric vehicle, the battery can be used to power the electrical apparatus, as well as to power low-voltage systems, such as instrument panels, lights, and radar equipment. Most batteries currently use lithium-ion batteries for storage of the electrical energy. The inventors of the present application found that since the lithium-ion battery mainly relies on the movement of lithium ions between the positive electrode and the negative electrode to realize the conversion between chemical energy and electrical energy, and the movement performance of lithium ions in the electrolyte solution is greatly weakened in low-temperature conditions, the performance of the lithium-ion battery is greatly affected by the temperature, especially in low-temperature situations, the available capacity of the battery is attenuated significantly, which will lead to the situation where the battery can neither be discharged nor charged in low-temperature conditions, and the rate performance of the battery is severely attenuated, thus greatly restricting the performance of the lithium battery. In addition, under low-temperature charging conditions, the battery is very susceptible to lithium plating reactions due to its low activity, which leads to an internal short circuit of the battery, thus posing a serious safety risk. Therefore, under low-temperature conditions, the lithium battery needs to be heated to a suitable temperature before being used.

At present, in order to ensure the performance of the lithium-ion battery, the battery is usually heated by means of an external heating source, for example, being heated by means of heating through a heating film or PTC water heating, where the heating film or PTC water heating are both in contact with the surface of the battery to transfer heat, the main advantages of which are that the heating structure is simple and the technology is mature. However, this approach requires an additional heating apparatus, and also requires providing an additional power source or heat source for the heating apparatus, and thus the structure is complex and the cost is high. At the same time, by means of the external heating source, the rate of temperature increase is low, which is generally in the range of 0.2-0.6° C./min, and the heating between the battery cells is not uniform, causing the temperature difference between the inside and outside of the battery cells to be large; and at the same time, because the external heating source performs heating by means of heat conduction, the heat is easily dissipated, resulting in a relatively low energy utilization rate.

Based on the above considerations, in order to solve the problems of low efficiency of heating and complex structure during battery heating that exist in the related art, embodiments of the present application propose a battery heating system and method, which utilize the principle that the battery itself generates heat when it is charged and discharged and make use of the characteristics that the battery has high internal impedance under low-temperature conditions and is prone to heat generation, and conduct frequent charging and discharging between battery packs and make different battery packs act as loads for each other, and which control the voltage conversion unit through the control unit to periodically regulate the input and output voltages of different battery packs so that the entire battery loop generates a high-frequency alternating current that, when passing through the low-temperature battery, uses the high impedance formed by the battery at low-temperature conditions to generate heat directly from the inside of the battery. This achieves rapid heating of the battery, and in this way, the battery is heated directly by the heat generated by itself, without the need for an additional heating apparatus, so that the energy utilization rate is high and the heating rate is high.

The battery heating system and method and the power supply system disclosed in embodiments of the present application can be applied in a battery management system as part of the battery management system, wherein the battery management system can be applied in, but is not limited to, an electrical apparatus such as a vehicle, a ship or an aircraft, thus facilitating rapid heating of the battery and improving the performance of the battery.

Examples of the present application provide an electrical apparatus that uses a battery containing the battery heating system proposed in embodiments of the present application as a power supply, and the electrical apparatus may be, but is not limited to, a mobile phone, a tablet, a laptop, an electric toy, an electric tool, a battery vehicle, an electric vehicle, a ship, a spacecraft, and so on. Among them, the electric toy may include a stationary or mobile electric toy, for example, a game console, an electric car toy, an electric ship toy, and an electric aircraft toy, and the like, and the spacecraft may include an aircraft, a rocket, a space shuttle and a spaceship, and the like.

For the convenience of description, the following embodiments are illustrated with an example in which the electrical apparatus being a vehicle 1000 according to an embodiment of the present application is a vehicle.

Please refer to FIG. 1. FIG. 1 is a schematic diagram of the structure of a vehicle provided in embodiments of the present application. The vehicle may be a fuel vehicle, a gas vehicle, or a new energy vehicle, and the new energy vehicle may be an all-electric vehicle, a hybrid vehicle, or an extended-range electric vehicle. The interior of the vehicle is provided with a battery 2000, and the battery 2000 may be provided at the bottom or head or tail of the vehicle. The battery 2000 may be used to power the vehicle. For example, the battery 2000 may be used as an operating power source of the vehicle. The vehicle further comprises a battery management system 1000 and a motor 3000, where the battery management system 1000 is used to control the battery 2000 to power the motor 3000, for example, for the operating power demand of the vehicle when it is starting, navigating and driving.

In some embodiments of the present application, the battery 2000 not only can serve as an operating power source of the vehicle, but also can serve as a driving power source of the vehicle, thus replacing or partially replacing fuel or natural gas to provide driving power for the vehicle.

The battery 2000 mentioned in the embodiments of the present application refers to a single physical module comprising one or more battery cells to provide higher voltage and capacity. For example, the battery 2000 mentioned in the present application may comprise a battery module or a battery pack or the like. There may be a plurality of battery cells, and the plurality of battery cells can be connected in series or parallel or in a mixed connection, wherein the mixed connection means that the plurality of battery cells are connected in both series and parallel. The multiple battery cells can be directly connected together in series or in parallel or in mixed connection, and then the entirety composed of the multiple battery cells can be accommodated in a box body; and of course, the multiple battery cells can first be connected in series or in parallel or in mixed connection to form batteries in the form of battery modules, then multiple battery modules can be connected in series or in parallel or in mixed connection to form an entirety, and accommodated in the box body. The battery 2000 may further include other structures, for example, the battery 2000 may further include a bus component for electrically connecting the plurality of battery cells. Here, each battery cell may be, but is not limited thereto, a lithium-ion secondary battery, a lithium-ion primary battery, a lithium-sulfur battery, a sodium/lithium-ion battery, or a magnesium-ion battery. The battery cells may be cylindrical, flat, rectangular, or in other shapes.

Figure 2:
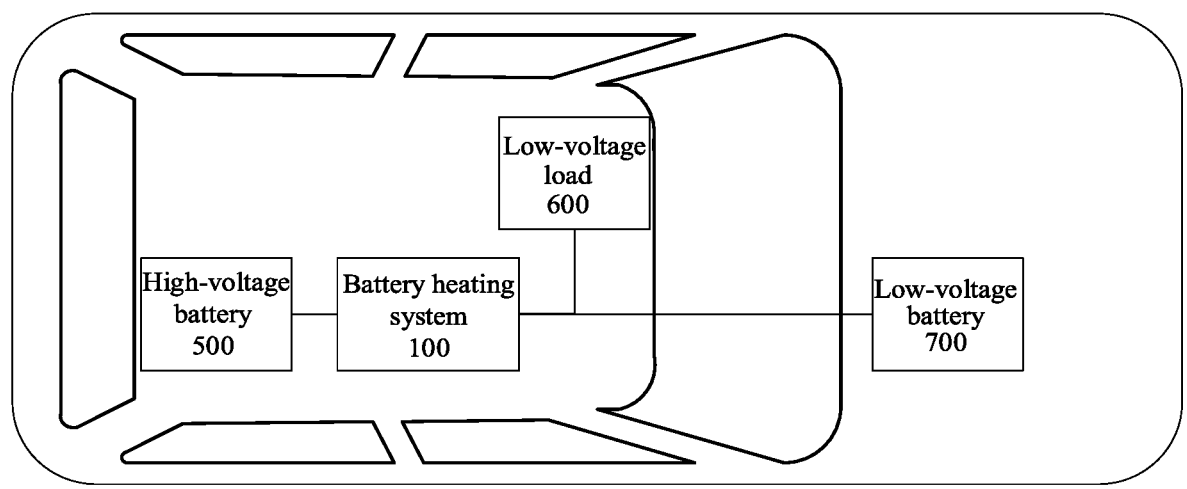
FIG. 2 illustrates a schematic diagram of a heating system for the electrical apparatus proposed in embodiments of the present application.

The battery management system 1000 refers to a system that manages the battery and is the core in the battery. The battery management system is a system that controls the charging and discharging process of the battery by collecting and calculating parameters such as the voltage, current, temperature and SOC, so as to protect the battery and improve the management of the comprehensive performance of the battery. It is an important link connecting the on-board power battery and the electric vehicle. The battery heating system 100 proposed in embodiments of the present application is an integral part of the battery management system 1000, as shown in FIG. 2, which is a schematic diagram of the application structure of the battery heating system 100 proposed in the present application. In the electrical apparatus, it usually comprises a high-voltage battery 500 and a low-voltage battery 700. The high-voltage battery 500 charges the low-voltage battery 700 after bucking by the voltage conversion unit, and together with the low-voltage battery 700, it supplies power to the low-voltage system of the whole vehicle, and the low-voltage battery 700 mainly provides the power source to the low-voltage loads of the electrical apparatus, such as instruments, lights and radar, etc. The low-voltage battery 700 is directly connected to the low-voltage load 600.

The battery heating system 100 proposed in embodiments of the present application comprises a control unit 120 and a voltage conversion unit 110. The voltage conversion unit 110 is responsible for the conversion processing of the voltage in the normal operating state; and when the battery needs to be heated, the voltage conversion unit 110, under the control of the control unit 120, performs boost or buck processing of the battery, and performs rapid heating of the battery to be heated 300.

Figure 3:
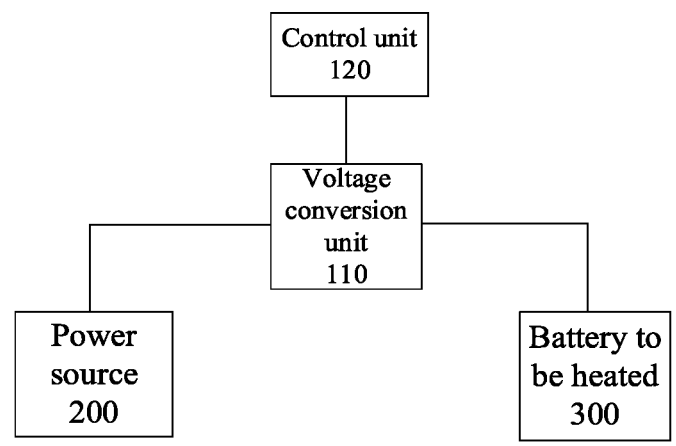
FIG. 3 illustrates a schematic diagram of a battery heating system proposed in embodiments of the present application.

Specifically, the battery heating system 100 proposed in embodiments of the present application, as shown in FIG. 3, comprises the voltage conversion unit 110 and the control unit 120. The voltage conversion unit 110 is electrically connected separately to a power source 200 and a battery to be heated 300 to receive a first voltage input by the power source 200 or a second voltage input by the battery to be heated 300. The control unit 120 is used for acquiring a charging and discharging frequency of the voltage conversion unit 110, and determining a charge transfer impedance of the battery to be heated 300 according to the charging and discharging frequency, calculating a safe amplitude current of the battery to be heated 300 according to the charge transfer impedance, and sending a control signal to the voltage conversion unit 110 according to the charging and discharging frequency and the safe amplitude current to cause the voltage conversion unit 110 to perform boost or buck processing of the first voltage or the second voltage according to the control signal.

As shown in FIG. 3, which is a schematic diagram of the structure of the battery heating system 100 proposed in embodiments of the present application, the control unit 120 is electrically connected to the voltage conversion unit 110 for controlling the voltage conversion unit 110. The two ends of the voltage conversion unit 110 are connected to the power source 200 and the battery to be heated 300, respectively, for converting the voltage output by the power source 200, or, for converting the voltage output by the battery to be heated 300.

In this case, the power source 200 is the carrier that provides input to the battery to be heated 300, and it can be a high-voltage battery 500 already equipped in the electrical apparatus itself, or an additionally configured low-voltage battery 700, or an external power source, and so on, which is intended to provide voltage input to the battery to be heated 300.

The battery to be heated 300 is a battery needing to be heated that is configured in the electrical apparatus itself, and it can be either a low-voltage battery 700 or a high-voltage battery 500. The battery to be heated 300 is usually a lithium battery, and when the battery to be heated 300 is at a low temperature, the available capacity of the battery will be significantly attenuated, and thus the battery can neither be discharged nor charged, and the rate performance of the battery is severely attenuated. Moreover, the battery is susceptible to lithium plating reactions under low-temperature charging conditions, which leads to an internal short circuit of the battery, thus posing a serious safety risk. This is because, during the charging process for lithium-ion batteries, lithium ions are deintercalated from the positive electrode and intercalated into the negative electrode. However, under certain circumstances, such as during charging in low-temperature situations, lithium ions that are deintercalated from the positive electrode cannot be intercalated into the negative electrode, and lithium ions can only precipitate on the surface of the negative electrode, and this phenomenon is called the lithium plating reaction. When the lithium plating reaction occurs in a lithium battery, an internal short circuit may occur in the battery, thus posing a serious safety risk.

In embodiments of the present application, in order to heat the battery to be heated 300 under low-temperature conditions, the self-heating of the battery to be heated is performed by periodically charging and discharging the battery to be heated 300 in combination with the characteristic that the impedance of the battery to be heated 300 is high under low-temperature conditions. In the process of frequent charging and discharging of the battery to be heated 300, the higher the charging and discharging current and the higher the charging and discharging frequency, the more heat is generated in the charging and discharging process of the battery to be heated 300, and the higher the rate of temperature rise. However, since the problem of lithium plating reaction is prone to occur when charging and discharging lithium batteries under low-temperature conditions, the balance relationship among the charging and discharging frequency, the safe amplitude current, and the efficiency of heating needs to be considered comprehensively when charging and discharging the lithium batteries, so that the heating of the battery to be heated 300 can be performed quickly while avoiding the lithium plating reaction of the battery to be heated 300 during the heating process.

Figure 4:
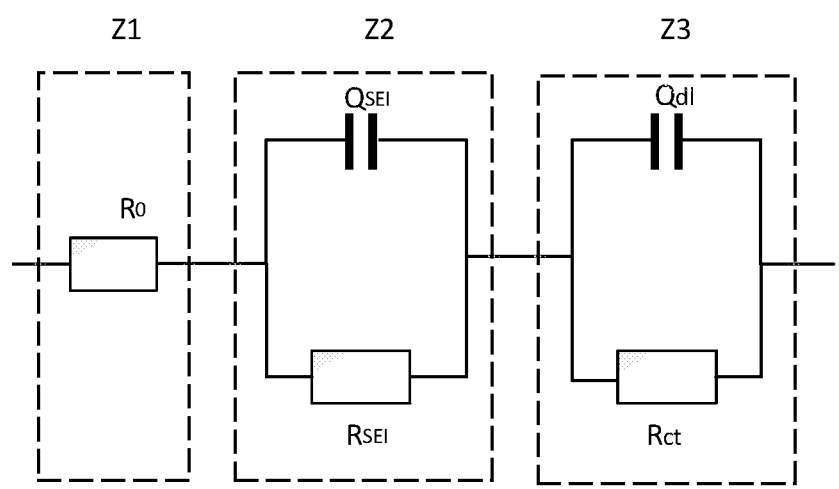
FIG. 4 illustrates a schematic diagram of an equivalent circuit for the battery internal impedance proposed in embodiments of the present application.

As shown in FIG. 4, a schematic diagram of an equivalent circuit of the battery internal impedance of a lithium-ion battery is illustrated. The equivalent circuit of the lithium-ion battery consists of three parts, comprising Z1, Z2 and Z3, where Z1 is the ohmic impedance component of the internal current collector, active material and electrolyte solution inside the battery; Z2 is the impedance component corresponding to the solid electrolyte phase interface (SEI) film, comprising $Q_{SEI}$ and $R_{SEI}$; and Z3 is the charge transfer impedance at the solid-liquid phase interface of the active material, comprising $Q_{dl}$ and $R_{CT}$.

Among them, $Q_{SEI}$ and $Q_{dl}$ belong to constant phase elements (CPEs), which are described by the CPE coefficient Q and the CPE index n, and the impedance expression thereof is as follows:

$$Z_{CPE} = \frac{1}{(j\omega)^n Q} = \frac{1}{\left(\cos\frac{n\pi}{2} + j\sin\frac{n\pi}{2}\right)\omega^n Q},$$

where Q is the CPE coefficient, n is the CPE index, and j is an imaginary unit.

Then the real part expression for the resistance of the equivalent circuit of this lithium-ion battery is as follows:

$$Z_{Re} = R_0 + \frac{\frac{1}{R_{SEI}} + Q_{SEI}\omega^{n_{SEI}}\cos\frac{n_{SEI}\pi}{2}}{\left(\frac{1}{R_{SEI}}\right)^2 + \frac{2}{R_{SEI}}Q_{SEI}\omega^{n_{SEI}}\cos\frac{n_{SEI}\pi}{2} + (Q_{SEI}\omega^{n_{SEI}})^2} + \frac{\frac{1}{R_{CT}} + Q_{dl}\omega^{n_{dl}}\cos\frac{n_{dl}\pi}{2}}{\cdots + (Q_{dl}\omega^{n_{dl}})^2}$$

where $Q_{SEI}$ and $n_{SEI}$ are the CPE index and CPE coefficient of the constant phase element for the Z2 part, respectively, and $Q_{dl}$ and $n_{dl}$ are the CPE index and CPE coefficient of the constant phase element for the Z3 part, respectively; $R_0$ is the ohmic impedance of the Z1 part of the equivalent circuit, $R_{SEI}$ is the internal impedance of the SEI film, and $R_{CT}$ is the charge transfer impedance. ω denotes the angular frequency of the charging and discharging of the battery, and j denotes the imaginary part of the impedance. It should be noted that each of the above parameters is temperature sensitive and needs to be calibrated at different temperatures, and each of the above parameters can be obtained by fitting the electrochemical impedance spectroscopy (EIS) of the lithium-ion battery.

Figure 5:
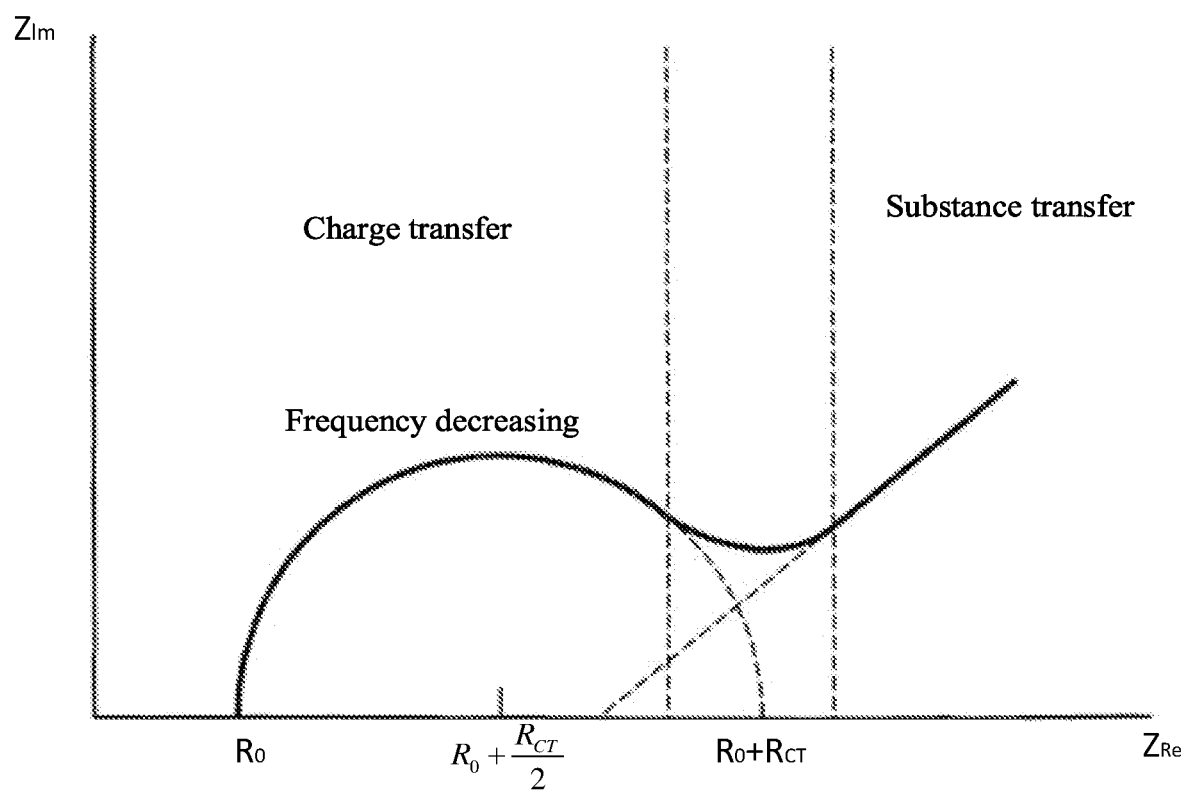
FIG. 5 illustrates a schematic diagram of the relationship between the battery internal impedance and the charging and discharging frequency proposed in embodiments of the present application.

As can be seen from the above, the real part $Z_{RE}$ of the impedance of the lithium-ion battery is related to the frequency. FIG. 5 illustrates a schematic diagram of the electrochemical impedance spectroscopy analysis of the lithium-ion battery after simplifying the above calculation of the internal impedance of the lithium battery, which illustrates the impedance of the lithium-ion battery at different charging and discharging frequencies. Here, the horizontal axis represents the real part impedance of the battery and the vertical axis represents the imaginary part impedance of the battery, and the electrochemical impedance spectroscopy can be divided into a charge transfer region and a mass transfer region, and the region between the charge transfer region and the mass transfer region is a mixed region.

In the charge transfer region, for a higher charging and discharging frequency of the battery, the battery only undergoes charge transfer during the charging and discharging process, and no mass diffusion occurs, i.e., no lithium plating reaction occurs; and in a very high frequency region, the battery exhibits purely resistive characteristics, and its impedance can be expressed as $Z=R_0$. In the mass transfer region, the charging and discharging frequency is low, and both charge transfer and mass transfer occur, i.e., the battery will have lithium plating reaction in this region, and the charging and discharging frequency in the mass transfer region is lower than that in the charge transfer region. In the mixed region, the lithium-ion battery transitions from charge transfer to mass transfer, and within this interval, both charge transfer and mass transfer occur. Therefore, as can be seen from the above, the frequency of charging and discharging should be as high as possible in order to avoid lithium plating reactions during the charging and discharging process. Among them, there is no uniform standard for the above high and low frequency values, and the general empirical division is: the high frequency range is 1 KHz-10 KHz; and the medium and low frequency range is 0.001 Hz-1 KHz. It is to be noted that the frequency ranges mentioned above are not fixed and can change under the influence of the battery temperature and the battery state.

It should be noted that, although in theory, the higher the charging and discharging frequency in the charge transfer region, the less likely lithium plating reactions will occur in the battery to be charged, and the charging and discharging frequency should preferably be set at a higher frequency to most effectively ensure the charging and discharging performance of the battery, in practice, however, because the charging and discharging control of the battery needs to be carried out through the voltage conversion unit 110, and the voltage conversion unit 110 needs to be switched between the charging process and the discharging process through a switch, while the length of time taken up by the switching of the switch makes it very difficult to switch between charging and discharging more quickly, as a result, the switching frequency of the voltage conversion unit 110 becomes a key factor that restricts the improvement of the charging and discharging frequency. Accordingly, in the present application, in order to reduce the complexity of the battery heating system 100 and to improve the charging and discharging efficiency, the inventors of the present application propose to directly adopt the maximum switching frequency of the voltage conversion unit 110 as the charging and discharging frequency in this battery heating system 100.

As mentioned above, the balance relationship among the charging and discharging frequency, the safe amplitude current, and the efficiency of heating needs to be considered comprehensively when charging and discharging lithium-ion batteries, so that the heating of the battery to be heated 300 can be performed quickly while avoiding the lithium plating reaction of the battery to be heated 300 during the heating process. Once the charging and discharging frequency is determined, it is needed to determine the safe amplitude current of the battery heating system 100 at a specific temperature condition based on that charging and discharging frequency.

Continuing to refer to the schematic diagram of the equivalent circuit of the battery internal impedance shown in FIG. 4, to avoid lithium plating reactions at the negative electrode of the lithium-ion battery, it is needed to satisfy the condition that the difference between solid and liquid phase potentials on the surface of the negative electrode particle is greater than the equilibrium potential for the lithium plating reaction, i.e:

$$\phi_s - \phi_l > U_{e,2},$$

where $\phi_s$ and $\phi_l$ are the potentials on the surface of the negative electrode particle at two sides, i.e., the solid and liquid, and $U_{e,2}$ is the equilibrium potential, which is usually considered to be 0 V.

During the lithium plating reaction, lithium ions need to gain electrons in order to be reduced to lithium metal, and it is generally believed that the lithium plating reaction initially occurs on the surface of graphite particles, i.e., inside the solid electrolyte phase interface (SEI) film, where the lithium intercalation reaction overpotential inside the SEI film is:

$$\eta = \phi_s - \phi_l - U_{e,1},$$

where $U_{e,1}$ is the equilibrium potential of the graphite negative electrode at a specific state of charge (SOC) of the battery.

According to the derivation process for the impedance spectroscopy of the lithium-ion battery, the lithium intercalation reaction overpotential inside the SEI film can be approximated by the linearization of the Butler-Volmer equation as follows:

$$\eta \approx i_{ct} R_{ct},$$

where $i_{ct}$ is the Faraday current and $R_{CT}$ is the charge transfer impedance, and during charging, $i_{ct}$ is negative, that is, the equivalent circuit corresponding to the graphite negative electrode is:

$$i_{ct} R_{ct} = -V_3,$$

where $V_3$ is the voltage across the charge transfer impedance $R_{CT}$, i.e., the voltage across the Z3 part in the equivalent circuit of the battery internal impedance as shown in FIG. 4.

Since the equilibrium potential of the graphite negative electrode at a specific state of charge (SOC) of the battery is $U_{e,1}$, in order to avoid the lithium plating reaction on the surface of the negative electrode, the voltage $V_3$ across the charge transfer impedance $R_{CT}$ needs to satisfy the following condition:

$$V_3 < U_{e,1} \quad (1);$$

in the equivalent circuit of the battery internal impedance shown in FIG. 4, the relationship between the integrated impedance of the Z3 part and the charging and discharging frequency is:

$$Z_3 = \frac{R_{ct}}{(j\omega)^{n_{dl}} Q_{dl} R_{ct} + 1},$$

when an AC excitation is applied to the lithium-ion battery, the voltage amplitude across the Z3 is:

$$|V_3| = I_{ac} |Z_3| \quad (2),$$

where $|Z_3|$ is the impedance value of the Z3 part of the equivalent circuit of the battery internal impedance, and is related to the frequency; and $I_{ac}$ is the amplitude of the applied AC current.

From the above Equations (1) and (2), it can be derived that the condition for the lithium-ion battery not to undergo lithium plating under the AC excitation is:

$$I_{ac} |Z_3| < U_{e,1},$$

that is, in order to avoid lithium plating reactions, the voltage amplitude across the Z3 part is always less than the equilibrium potential of the graphite negative electrode under the specific state of charge (SOC) of the battery.

From the above, it can be seen that in embodiments of the present application, in the case where the maximum switching frequency of the battery conversion unit is used as the charging and discharging frequency in this battery heating system 100, at this charging and discharging frequency, it can be seen from FIG. 5 that the resistance of the Z3 part is equal to the charge transfer impedance $R_{CT}$ of the lithium battery, that is:

$$I_{ac} < \frac{U_{e,1}}{Z_3} = \frac{U_{e,1}}{R_{ct}},$$

as a result, it can be determined that the safe amplitude current at the above charging and discharging frequency is $$\frac{U_{e,1}}{R_{ct}}.$$

That is, during the charging and discharging of the battery to be heated, its charging current should be less than $$\frac{U_{e,1}}{R_{ct}}.$$

With the above process, the charging and discharging frequency for charging and discharging the battery to be heated 300 is determined, and the charge transfer impedance is determined based on the charging and discharging frequency, and then the safe amplitude current for charging and discharging is determined based on the charge transfer impedance. It should be noted that the above charge transfer impedance and the corresponding safe amplitude current are closely related to the temperature and the state of charge (SOC) of the battery, and are not constant, but will constantly change with the change of the temperature. The charge transfer impedance at a specific temperature and a specific state of charge (SOC) and its corresponding safe amplitude current can be obtained by searching in the electrochemical impedance spectroscopy (EIS) of the battery to be charged, that is, they can be obtained by presetting this electrochemical impedance spectroscopy (EIS) in the control unit 120 and then searching in it by the control unit 120 under specific conditions, and the specific searching approach will not be repeated here.

In the related art, for the battery to be heated 300, the battery manufacturer sets a charging cut-off voltage $V_{max}$ when the battery leaves the factory and different charging currents are set according to the charging cut-off voltage, and thus there will be different charging capacities for the cut-off voltage. This charging cut-off voltage will generally be a conservative value and is generally applicable to DC operating conditions, while in AC operating conditions, it cannot truly reflect the condition of the battery. For example, when the SOC is low, the open-circuit voltage $V_{ocv}$ under this SOC is relatively small, which causes the current of $$\frac{V_{max} - V_{ocv}}{R}$$

to be too high, resulting in the occurrence of lithium plating reactions of the battery. When the SOC is high, the open-circuit voltage $V_{ocv}$ under this SOC is relatively large, which causes the current of $$\frac{V_{max} - V_{ocv}}{R}$$

to be too small, resulting in low efficiency of battery heating, which greatly weakens the effect of heating.

Figure 6:
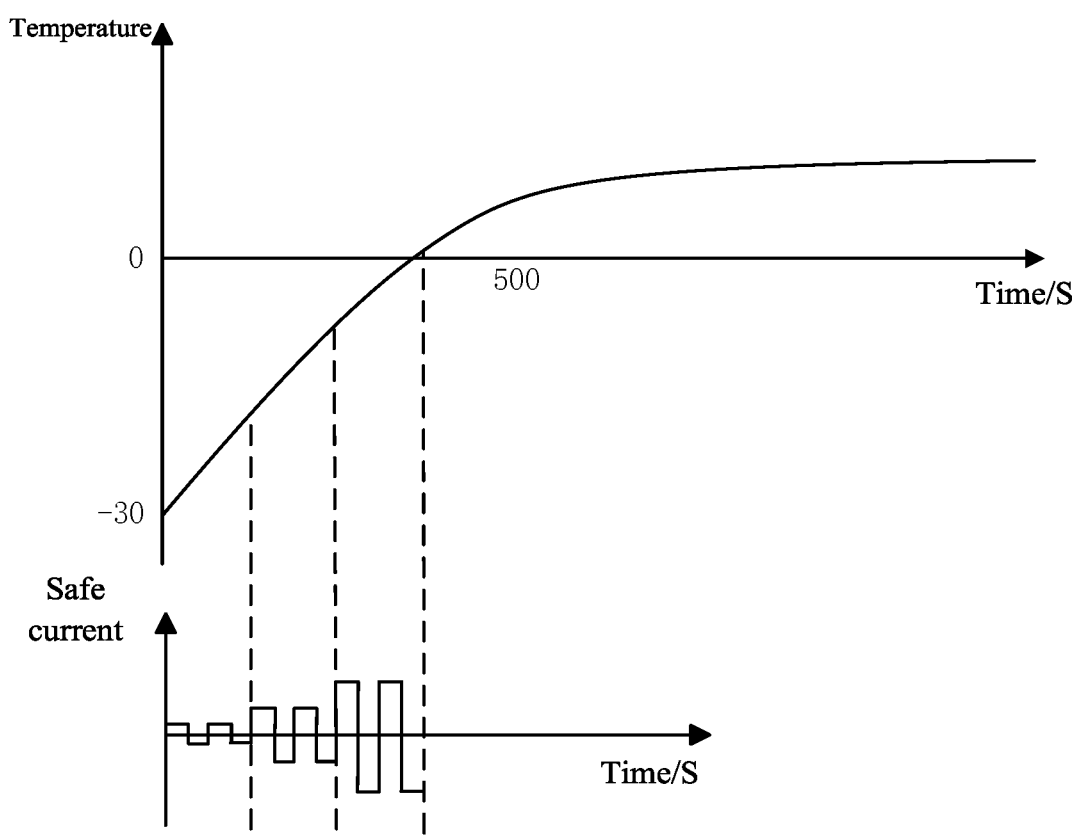
FIG. 6 illustrates a schematic diagram of the relationship between the battery temperature and safety current proposed in embodiments of the present application.

In embodiments of the present application, the safe amplitude current is determined according to the equilibrium potential $U_{e,1}$ of the graphite negative electrode of the lithium battery and the charge transfer impedance $R_{CT}$ without relying on the set charging cut-off voltage and open-circuit voltage, which enables the true state of the battery to be charged to be reflected to the greatest extent and breaks through the limitation of the cut-off voltage set by the manufacturer, thus greatly improving the efficiency of heating. As shown in FIG. 6, it is illustrated that under the effect of the solution proposed in this embodiment, the battery to be heated 300 can be heated up rapidly in a short time and the safe amplitude current becomes gradually larger, which greatly improves the effect of heating of the battery to be heated 300.

After determining the frequency of charging and discharging the battery to be heated 300 and the safe amplitude current, the control unit 120 sends a control signal to the voltage conversion unit 110 according to the charging and discharging frequency and the safe amplitude current to cause the voltage conversion unit 110 to perform boost or buck processing of the first voltage or the second voltage of the power source and the battery to be heated according to the control signal. The charging and discharging frequency is used as the maximum charging and discharging frequency, and the safe amplitude current is used as the maximum charging and discharging current.

The control unit 120 sends the control signal to the voltage conversion unit 110 according to this charging and discharging frequency and the safe amplitude current in a first time period so that a first voltage output by the power source 200 is higher than a second voltage of the battery to be heated 300, thereby performing forward charging of the battery to be recharged. In a second time period, the control unit 120 sends the control signal to the voltage conversion unit 110 so that the first voltage of the power source 200 is lower than the second voltage of the battery to be heated 300, thereby putting the battery to be heated 300 in a discharged state. When performing boost processing of the first voltage or buck processing of the first voltage in the first time period and the second time period, it is needed to keep the voltage difference between the first voltage and the second voltage within a certain range so that the maximum charging and discharging current of the battery to be heated 300 in the charging state is less than the determined safe amplitude current.

Therefore, as can be seen from the above, in embodiments of the present application, by determining the safe amplitude current by the control unit 120 according to the charging and discharging frequency of the voltage conversion unit 110 and the charge transfer impedance, and sending the control signal to the voltage conversion unit 110 according to the charging and discharging frequency and the safe amplitude current to cause the voltage conversion unit 110 to perform boost or buck processing of the first voltage or the second voltage according to the control signal, the effect of heating of the battery is greatly improved and the efficiency of heating is increased.

In some embodiments, the battery heating system 100 also comprises a temperature monitoring unit 130, wherein the temperature monitoring unit 130 is used for monitoring the temperature of the battery to be heated 300 and sending the temperature to the control unit 120, and the control unit 120 determines the charge transfer impedance of the battery to be heated 300 according to the temperature as well as the charging and discharging frequency of the voltage conversion unit 110.

Figure 7:
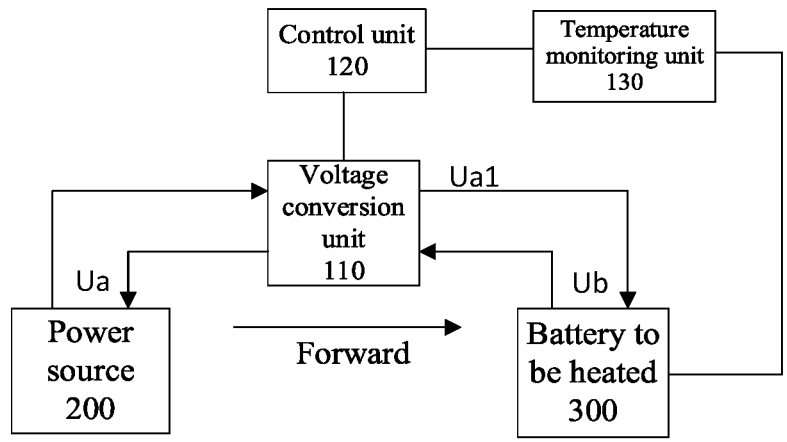
FIG. 7 illustrates a schematic diagram of the forward charging of the battery heating system proposed in embodiments of the present application.

As shown in FIG. 7, the battery heating system 100 proposed in embodiments of the present application also comprises a temperature monitoring unit 130, wherein the temperature monitoring unit 130 is connected to the battery to be heated 300 and is used for monitoring the temperature of the battery to be heated 300 and sending the monitored temperature information to the control unit 120 so that the control unit 120 controls the charging and discharging frequency of the voltage conversion unit 110 and the charging and discharging current according to the temperature information of the battery to be heated.

The temperature monitoring unit 130 may be a temperature sensor, which may include a thermocouple, a negative temperature coefficient temperature sensor or an infrared sensor, etc., and is usually provided around the battery to be heated 300 or on the surface thereof, so that the temperature of the battery to be heated 300 can be accurately monitored. The temperature monitoring unit 130 periodically acquires the temperature information for the battery to be heated 300, sends the temperature information to the control unit 120, and the control unit 120 periodically determines the safe amplitude current according to the temperature information, the state of charge (SOC) of the battery to be heated 300, and the charging and discharging frequency of the voltage conversion unit 110, and regulates the charging and discharging voltage of the power source 200 and the battery to be heated 300 according to the safe amplitude current.

In this way, it is possible to monitor the state of the battery to be heated 300 in real time and to correct the charging and discharging voltage, so that the battery to be heated 300 is always in an optimal effect of heating, thus greatly improving the efficiency of heating.

In some embodiments, the control unit 120 is further used for determining the charge transfer impedance of the battery to be heated 300 according to the state of charge (SOC) of the battery to be heated 300, the temperature, and the charging and discharging frequency; and the control unit 120 is further used for calculating the safe amplitude current of the battery to be heated 300 according to a lithium plating potential of the battery to be heated 300 and the charge transfer impedance.

The control unit 120 acquires the state of charge of the battery to be heated 300 in advance, wherein the state of charge (SOC) can be acquired in various manners, one of which is that when the battery leaves the factory, the manufacturer will calibrate the SOC to indicate the states of charge (SOCs) of the battery at specific temperatures and voltages. The SOC can also be calculated through the ampere-time integration, where the battery management system records the current flowing through the battery and then calculates the current SOC with the time of use. It is also possible to use the combination of the above two methods for the acquisition of the SOC. Of course, there are other SOC acquisition methods, which are not repeated here.

After the control unit 120 acquires the state of charge (SOC) of the battery to be heated 300, the charge transfer impedance $R_{CT}$ of the battery to be heated 300 is determined through the electrochemical impedance spectroscopy (EIS) of the battery to be heated 300 according to the temperature information acquired by the temperature monitoring unit 130 and the charging and discharging frequency.

The control unit 120 further acquires the lithium plating potential of the battery to be heated 300, wherein the lithium plating potential is the equilibrium potential $U_{e,1}$ of the graphite negative electrode of the battery to be heated 300 at a specific state of charge (SOC), and in order to avoid the occurrence of the lithium plating reaction on the surface of the graphite negative electrode, the voltage $V_3$ across the charge transfer impedance $R_{CT}$ needs to satisfy:

$$V_3 < U_{e,1};$$

in the equivalent circuit of the battery internal impedance shown in FIG. 4, the relationship between the integrated impedance of the Z3 part and the charging and discharging frequency is:

$$Z_3 = \frac{R_{ct}}{(j\omega)^{n_{dl}} Q_{dl} R_{ct} + 1},$$

when an AC excitation is applied to the lithium-ion battery, the voltage amplitude across the Z3 is:

$$|V_3| = I_{ac}|Z_3|;$$

where $|Z_3|$ is the impedance value of the Z3 part of the equivalent circuit of the battery internal impedance, and is related to the frequency; and $I_{ac}$ is the amplitude of the applied AC current.

The condition for the lithium-ion battery not to undergo lithium plating under the AC excitation is:

$$I_{ac}|Z_3| < U_{e,1},$$

that is, in the equivalent circuit of the graphite negative electrode of the lithium-ion battery, the voltage amplitude across the Z3 part is always less than the equilibrium potential of the graphite negative electrode under the specific state of charge (SOC) of the battery.

In embodiments of the present application, in the case where the maximum switching frequency of the battery conversion unit is used as the charging and discharging frequency in this battery heating system 100, at this charging and discharging frequency, it can be seen from FIG. 5 that the resistance of the Z3 part is equal to the charge transfer impedance $R_{CT}$ of the lithium battery, that is:

$$I_{ac} < \frac{U_{e,1}}{Z_3} = \frac{U_{e,1}}{R_{ct}},$$

it can be determined that the safe amplitude current at the above charging and discharging frequency is $$\frac{U_{e,1}}{R_{ct}}.$$

The safe amplitude current is acquired according to the equilibrium potential of the graphite negative electrode and the charge transfer impedance without relying on the set charging cut-off voltage and open-circuit voltage, which enables the true state of the battery to be charged to be reflected to the greatest extent and breaks through the limitation of the cut-off voltage set by the manufacturer, thus greatly improving the efficiency of heating the battery to be heated.

In some embodiments, in order to improve the efficiency of heating the battery, the control unit 120 pre-stores a state of charge of the battery to be heated 300, a temperature, a charging and discharging frequency, and a safe amplitude current mapping table; and the control unit 120 is further used for determining a safe amplitude current of the battery to be heated 300 in its current state by searching in the safe amplitude current mapping table according to the state of charge of the battery to be heated 300, the temperature and the charging and discharging frequency.

According to the electrochemical impedance spectroscopy (EIS) of the battery to be heated 300, the safe amplitude current of the battery is definite at the specific temperature, charging and discharging frequency, and state of charge. Therefore, the control unit 120 can pre-store a state of charge of this battery to be heated 300, a temperature, a charging and discharging frequency, and a safe amplitude current mapping table and, during the heating process, determine the corresponding safe amplitude current in real time according to the acquired state of charge and temperature of the battery to be heated 300. As shown in Table 1, a schematic table of the state of charge, temperature, charging and discharging frequency, and safe amplitude current mapping table for the battery to be heated 300 is illustrated.

TABLE 1

| | The ratio of the safe amplitude current allowed at X HZ to the battery capacity | | | | | | | | | | | | |
|---|---|---|---|---|---|---|---|---|---|---|---|---|---|
| | SOC | 0% | 10% | 20% | 30% | 40% | 50% | 60% | 70% | 80% | 85% | 90% | 95% |
| Temperature 1 | −25 | 0.40 | 0.40 | 0.31 | 0.26 | 0.22 | 0.18 | 0.16 | 0.14 | 0.12 | 0.11 | 0.08 | 0.06 |
| Temperature 2 | −20 | 0.70 | 0.70 | 0.54 | 0.41 | 0.35 | 0.26 | 0.22 | 0.19 | 0.16 | 0.14 | 0.10 | 0.08 |
| Temperature 3 | −15 | 0.89 | 0.89 | 0.70 | 0.56 | 0.47 | 0.38 | 0.33 | 0.28 | 0.24 | 0.21 | 0.16 | 0.13 |
| Temperature 4 | −10 | 1.15 | 0.96 | 0.88 | 0.72 | 0.61 | 0.53 | 0.46 | 0.40 | 0.35 | 0.30 | 0.24 | 0.16 |
| Temperature 5 | −5 | 1.36 | 1.36 | 1.09 | 0.91 | 0.74 | 0.62 | 0.55 | 0.46 | 0.39 | 0.34 | 0.26 | 0.16 |
| Temperature 6 | 0 | 1.65 | 1.65 | 1.32 | 1.10 | 0.90 | 0.75 | 0.67 | 0.57 | 0.47 | 0.42 | 0.26 | 0.16 |
| Temperature 7 | 5 | 1.95 | 1.95 | 1.56 | 1.31 | 1.05 | 0.87 | 0.80 | 0.68 | 0.56 | 0.48 | 0.26 | 0.16 |
| Temperature 8 | 10 | 1.95 | 1.95 | 1.56 | 1.31 | 1.05 | 0.87 | 0.80 | 0.68 | 0.56 | 0.48 | 0.26 | 0.16 |

In the process of heating the battery to be heated 300, if the charging and discharging frequency, the temperature, and the state of charge are determined, the safe amplitude current can be acquired in time by searching in this mapping table.

As can be seen from Table 1, under a specific frequency XHZ and temperature condition, the lower the SOC, the higher the allowed safe amplitude current, and the better the effect of heating. Under the specific frequency XHZ and SOC condition, as the temperature increases, the allowed safe amplitude current becomes higher, and when a certain temperature condition is reached, the allowed safe amplitude current remains stable.

In some embodiments, the voltage conversion unit 110 is used for performing boost or buck processing of the first voltage or the second voltage in a first time period so that a charging current received by the battery to be heated 300 is less than the safe amplitude current. The voltage conversion unit 110 is further used for performing boost or buck processing of the first voltage or the second voltage in a second time period so that a discharging current output from this battery to be heated 300 is less than this safe amplitude current.

Figure 8:
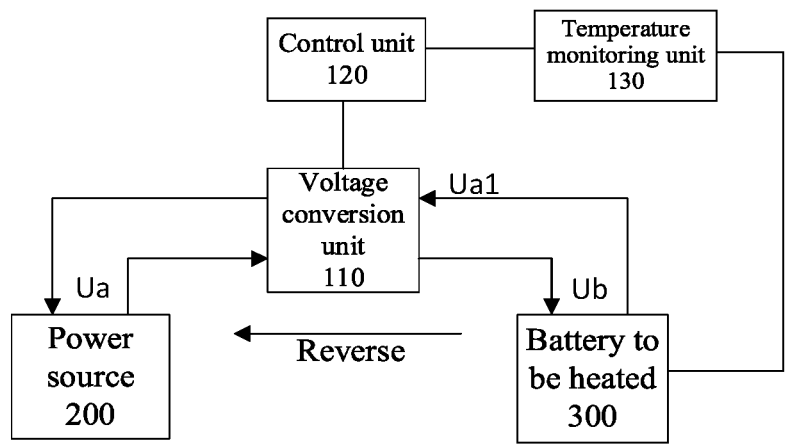
FIG. 8 illustrates a schematic diagram of the reverse discharging of the battery heating system proposed in embodiments of the present application.

As shown in FIGS. 7 and 8, the topology diagrams of the heating of the battery to be heated 300 by the voltage conversion unit 110 through the power source 200 under the control of the control unit 120 are illustrated, wherein the communication between the control unit 120 and the voltage conversion unit 110 can be performed via a CAN bus or other buses.

FIG. 7 illustrates a schematic diagram of an operating mode in which in a first time period, the power source 200 is discharged to perform forward charging of the battery to be heated 300. In the initial conditions, the control unit 120 first determines the charging and discharging frequency K1 and the safe amplitude current I1 of the voltage conversion unit 110 according to the state of charge (SOC) of the battery to be heated 300. At this time, the power source 200 is discharged and the battery to be heated 300 is charged, and the output voltage of the power source 200 is Ua and the voltage of the battery to be heated 300 is Ub. The voltage conversion unit 110 boosts the voltage Ua output from the power source 200, and after the boosting of Ua by the voltage conversion unit 110, Ua1 is obtained, then I1=(Ua1−Ub)/R, where R is the equivalent resistance value of the battery heating system 100. Among them, Ua1 needs to be determined by the control unit according to the safe amplitude current I1 so as to ensure that the charging current of the battery to be heated 300 is less than the safe amplitude current, and to ensure that no lithium plating reaction occurs in the battery to be heated 300 while charging the battery to be heated 300.

FIG. 8 illustrates a schematic diagram of an operating mode in which in a second time period, the voltage conversion unit 110, under the control of the control unit 120, causes the battery to be heated 300 to be discharged to charge the power source 200. Compared to the forward charging in FIG. 7, FIG. 8 illustrates the reverse discharging, and the two are in opposite directions. The output voltage of the battery to be heated 300 is Ub, and the voltage of the power source 200 is Ua. The control unit 120 controls the voltage conversion unit 110 to perform buck processing of Ua, and after the bucking of Ua by the voltage conversion unit 110, Ua2 is obtained, then I1=(Ub−Ua2)/R, where R is the equivalent resistance value of this battery heating system 100. The discharging current output from this battery to be heated 300 is less than this safe amplitude current.

The above conversion period of forward charging and reverse discharging is the charging and discharging frequency K1, that is, the battery to be heated 300 and the power source 200 are in the charging state for half of the time and in the discharging state for half of the time, i.e., switching between charging and discharging. According to the heat generation equation of the resistance:

$$P=I^2Rt,$$

it can be seen that the higher the current, the better the heat generation effect. Since the control unit 120 will keep regulating the safe amplitude current as the battery charging and discharging proceeds, the effect of heating on the battery will get better as the charging and discharging proceeds.

The battery heating method proposed in embodiments of the present application is applied in various electrical apparatuses, such as electric vehicles, etc. Since the electrical apparatus usually contains a high-voltage battery 500 and a low-voltage battery 700, the high-voltage battery 500 is generally used to provide power to the electrical apparatus, and the low-voltage battery 700 is generally used to provide the power source 200 to the low-voltage devices of the electrical apparatus. In order to heat the battery to be heated 300, a variety of ways can be used as the power source 200 to provide the heating power source to the battery to be heated 300, and for the purpose of illustration, an electric vehicle is used as an example below.

Figure 9:
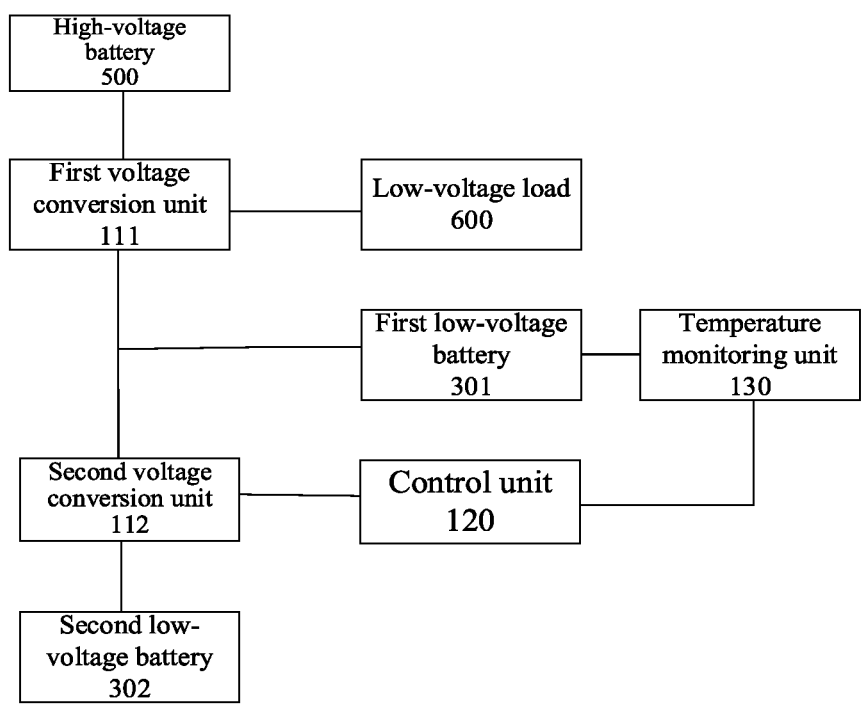
FIG. 9 illustrates a topology diagram of the heating of a low-voltage battery proposed in embodiments of the present application.

As shown in FIG. 9, the electrical apparatus comprises a high-voltage battery 500, a first voltage conversion unit 111, a first low-voltage battery 301 and a low-voltage load 600, wherein the high-voltage battery 500 is used to provide power to the electrical apparatus on the one hand, and on the other hand, also charges the first low-voltage battery 301 through the first voltage conversion unit 111, and the first low-voltage battery 301 provides a power source for the low-voltage load 600. In order to quickly heat the first low-voltage battery 301, a second low-voltage battery 302, a second voltage conversion unit 112, a control unit 120 and a temperature monitoring unit 130 are provided in the electrical apparatus.

Under normal operating conditions, the high-voltage battery 500 charges the first low-voltage battery 301 through the first voltage conversion unit 111, and the first low-voltage battery 301 provides the power source 200 to the low-voltage load 600. When the temperature monitoring unit 130 monitors that the temperature of the first low-voltage battery 301 is below a certain threshold, the performance of the first low-voltage battery 301 is affected relatively significantly, so that it needs to be heated first, then the control unit 120 sends a control signal to the second voltage conversion unit 112 to control the second voltage conversion unit 112 to cause, in accordance with the determined charging and discharging frequency and safe amplitude current, the first low-voltage battery 301 and the second low-voltage battery 302 to be charged and discharged continuously, so that the temperature of the first low-voltage battery 301 gradually increases, thereby achieving rapid heating of the first low-voltage battery 301.

Figure 10:
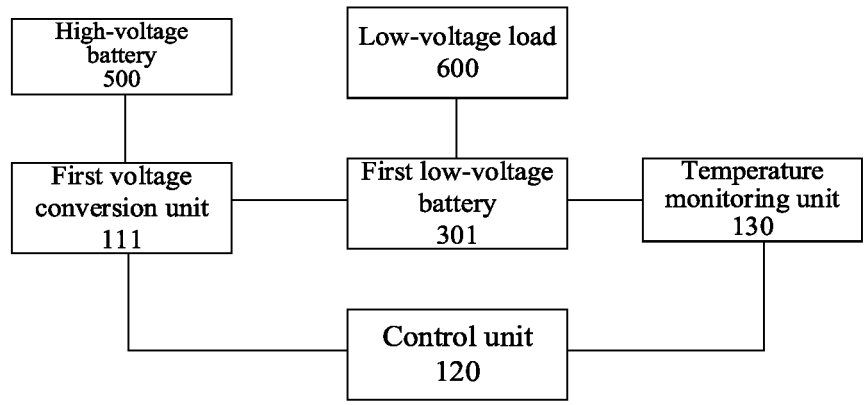
FIG. 10 illustrates a topology diagram of the heating of a high-voltage battery and a low-voltage battery proposed in embodiments of the present application.

FIG. 10 illustrates another battery heating topology diagram, which comprises a high-voltage battery 500, a first voltage conversion unit 111, a first low-voltage battery 301, a low-voltage load 600, a control unit 120 and a temperature monitoring unit 130, wherein the control unit 120 is connected to the first voltage conversion unit 111 for controlling the first voltage conversion unit 111 to heat the first low-voltage battery 301. In this topology, the battery heating system 100 shares one voltage conversion unit with the high-voltage battery 500 of the electrical apparatus, and by modifying the original voltage conversion unit, it is allowed to perform high-frequency interactions between the high-voltage and low-voltage batteries.

In the normal operating state, the high-voltage battery 500 provides power for the electrical apparatus, and at the same time, the first low-voltage battery 301 is charged by the first voltage conversion unit 111, and the first low-voltage battery 301 provides power for the low-voltage load 600. When the temperature monitoring unit 130 monitors that the temperature of the first low-voltage battery 301 is below a certain threshold, the performance of the first low-voltage battery 301 is affected relatively significantly, so that it needs to be heated first, then the control unit 120 sends a control signal to the first voltage conversion unit 111 to control the first voltage conversion unit 111 to cause, in accordance with the determined charging and discharging frequency and safe amplitude current, the first low-voltage battery 301 and the high-voltage battery 500 to be charged and discharged continuously, so that the temperature of the first low-voltage battery 301 gradually increases, thereby achieving rapid heating of the first low-voltage battery 301. In this way, the high-voltage battery and low-voltage battery share one voltage conversion unit, thus simplifying the structure and reducing the complexity of the electrical apparatus.

Figure 11:
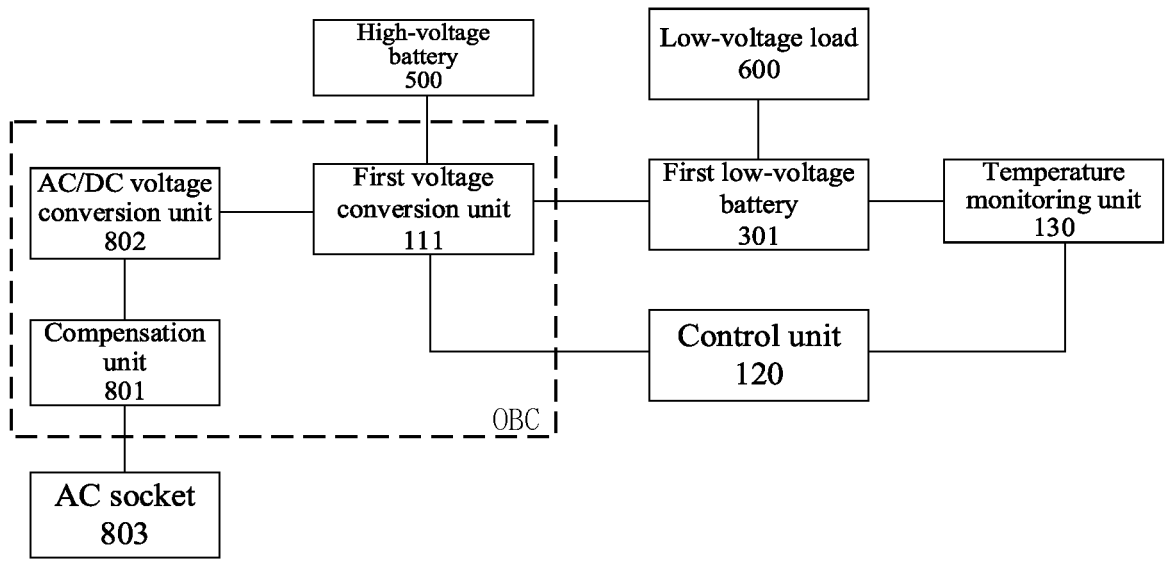
FIG. 11 illustrates a topology diagram of the heating of an OBC, a high-voltage battery, and a low-voltage battery proposed in embodiments of the present application.

FIG. 11 illustrates another battery heating topology diagram in which the battery heating system 100 of the electrical apparatus, the high-voltage battery 500, and the on board charger (OBC) are integrated together. As shown in FIG. 11, the on board charger (OBC) comprises an AC socket 803, a compensation unit 801, an AC/DC voltage conversion unit 802, and a first voltage conversion unit 111. In FIG. 11, the high-voltage battery 500, the on board charger (OBC), and this battery heating system share one first voltage conversion unit 111. When the first low-voltage battery 301 needs to be heated, the high-voltage battery 500 or the on board charger (OBC) can be used as a power source to provide a heating power source for the first low-voltage battery 301.

When heating the first low-voltage battery 301 through the on board charger (OBC), in the normal operating state, the high-voltage battery 500 charges the first low-voltage battery 301 through the first voltage conversion unit 111, and the first low-voltage battery 301 provides a power source to the low-voltage load 600. When the temperature monitoring unit 130 monitors that the temperature of the first low-voltage battery 301 is below a certain threshold, the performance of the first low-voltage battery 301 is affected relatively significantly, so that it needs to be heated first, then the on board charger (OBC) is connected to the first voltage conversion unit 111, and the control unit 120 sends a control signal to the first voltage conversion unit 111 to control the first voltage conversion unit 111 to cause, in accordance with the determined charging and discharging frequency and safe amplitude current, the first low-voltage battery 301 and the on board charger (OBC) to be charged and discharged continuously, so that the temperature of the first low-voltage battery 301 gradually increases, thereby achieving rapid heating of the first low-voltage battery 301. In this way, the on board charger (OBC) is used to heat the low-voltage battery, and the on board charger (OBC), the high-voltage battery, and the low-voltage battery share one voltage conversion unit, thus simplifying the structure and reducing the complexity of the electrical apparatus.

Figure 12:
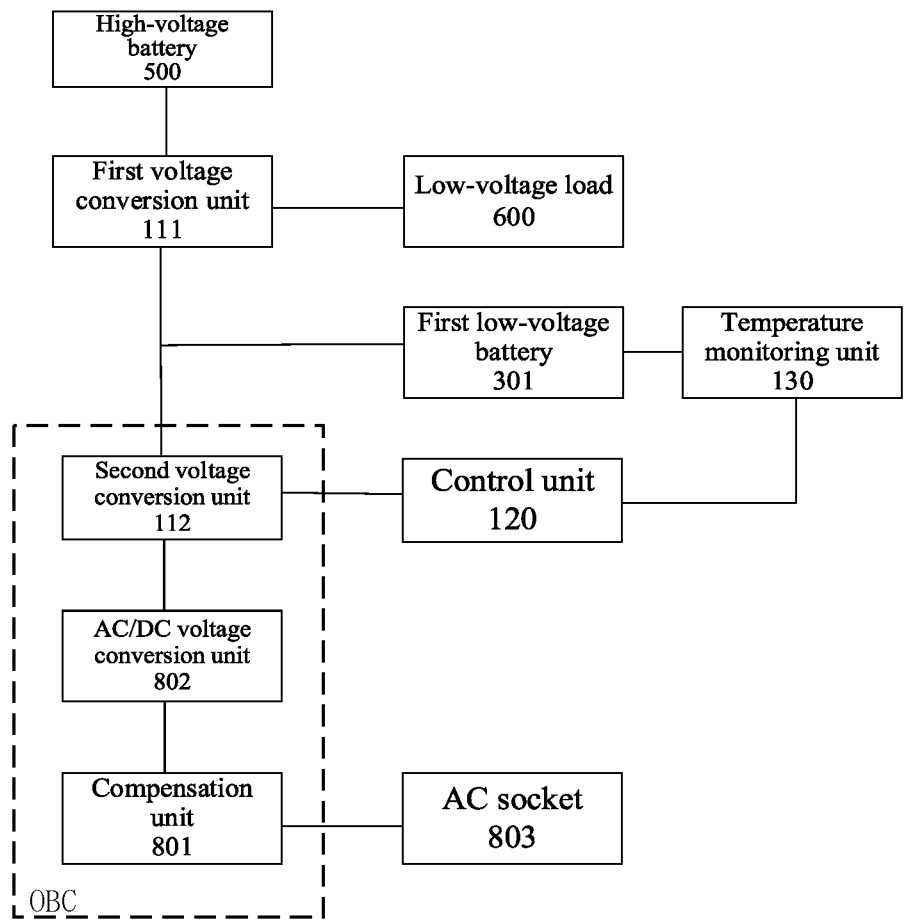
FIG. 12 illustrates a topology diagram of the heating of an OBC and a low-voltage battery proposed in embodiments of the present application.
Figure 13:
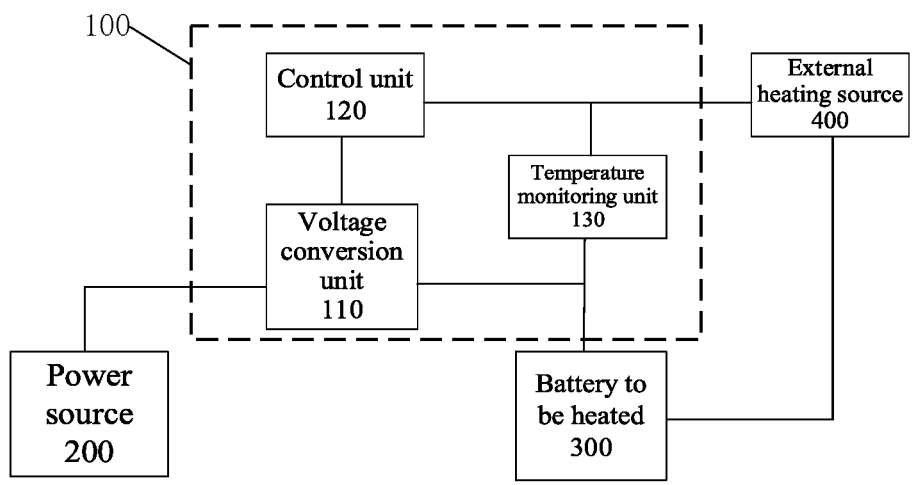
FIG. 13 illustrates a topology diagram of a battery heating system and an external heat source proposed in embodiments of the present application.

FIG. 12 illustrates another battery heating topology diagram in which the battery heating system 100 of the electrical apparatus is integrated with the on board charger (OBC). As shown in FIG. 12, the high-voltage battery 500 charges the first low-voltage battery 301 through the first voltage conversion unit 111. The on board charger (OBC) comprises an AC socket 803, a compensation unit 801, an AC/DC voltage conversion unit 802, and a second voltage conversion unit 112. In FIG. 12, the on board charger (OBC) and the heating system share one second voltage conversion unit 112, and the on board charger (OBC) can be used as a power source to provide a heating power source to the first low-voltage battery 301, and this control unit 120 is connected to the second voltage conversion unit 112.

Under the normal operating state, the high-voltage battery 500 charges the first low-voltage battery 301 through the first voltage conversion unit 111, and the first low-voltage battery 301 provides a power source to the low-voltage load 600. When the temperature monitoring unit 130 monitors that the temperature of the first low-voltage battery 301 is below a certain threshold, the performance of the first low-voltage battery 301 is affected relatively significantly, so that it needs to be heated first, then the control unit 120 sends a control signal to the second voltage conversion unit 112 to control the second voltage conversion unit 112 to cause, in accordance with the determined charging and discharging frequency and safe amplitude current, the first low-voltage battery 301 and the on board charger (OBC) to be charged and discharged continuously, so that the temperature of the first low-voltage battery 301 gradually increases, thereby achieving rapid heating of the first low-voltage battery 301. In this way, the on board charger (OBC) is used to heat the low-voltage battery, and the on board charger (OBC) and the low-voltage battery share one voltage conversion unit, thus simplifying the structure and reducing the complexity of the electrical apparatus.

In some embodiments, the control unit 120 is further used for sending a control signal to the voltage conversion unit when the temperature is less than a first preset threshold; and stopping outputting the control signal when the temperature is greater than or equal to the first preset threshold.

The temperature monitoring unit 130 monitors the temperature, and when the temperature of the battery to be heated 300 is greater than or equal to the first preset threshold, it indicates that the temperature of the battery to be heated 300 can already ensure the normal operation of the battery, then the control unit 120 stops outputting the control signal and stops heating the battery to be heated 300.

Of course, because the internal impedance of the lithium battery will become larger when the temperature is lower, the effect of heating is more obvious when the battery to be heated is heated in this way in low-temperature situations. When the temperature of the lithium battery reaches a certain threshold, the internal impedance of the battery has been significantly reduced, and at this time, the effect will be greatly reduced if it continues to be heated through this battery heating system. Therefore, at this time, the control unit 120 can stop outputting the control signal and stop heating the battery to be heated 300.

By monitoring the temperature of the battery to be heated 300 in real time, the heating process can be controlled in time according to the condition of the battery to be heated 300, and when the effect of heating is not good, the heating process can be terminated in time to save energy.

In some embodiments, the battery heating system 100 comprises an external heating source 400, and the control unit 120 is used for starting the external heating source 400 to heat the battery to be heated 300 when the temperature is less a the second preset threshold, and turning off the external heating source 400 when the temperature is greater than or equal to the second preset threshold, the first preset threshold being less than the second preset threshold.

As shown in FIG. 12, the battery heating system 100 further comprises an external heating source 400, the external heating source 400 comprising heating through a heating film or PTC water heating, where the heating film or PTC water heating are both in contact with the surface of the battery to transfer heat, the main advantages of which are that the heating structure is simple and the technology is mature. In embodiments of the present application, the characteristics of lithium batteries are combined and the two heating approaches are combined.

When the temperature is below the first preset threshold, the control unit 120, while controlling the voltage conversion unit to heat the battery to be heated 300, also starts the external heating source 400 to heat the battery to be heated 300. When the temperature is greater than or equal to the first preset threshold, since the internal impedance of the battery has been significantly reduced, the effect of heating by means of frequent charging and discharging has been greatly reduced, and in this case, the battery heating system stops heating the battery, but since the temperature of the battery to be heated 300 has not yet reached the preset second threshold, at this time, the external heating source 400 continues to heat the battery to be heated 300 until the temperature of the battery to be heated 300 reaches the preset second threshold. At this point, the temperature of the battery to be heated 300 has met the requirements of the normal use, then the external heating source 400 can be turned off.

In embodiments of the present application, by combining the self-heating mode of the battery with the conventional mode of heating with an external heating source, the effect of heating the battery to be heated is improved and the efficiency of heating is increased.

In summary, with the battery heating system proposed in embodiments of the present application, by determining the safe amplitude current by the control unit according to the charging and discharging frequency of the voltage conversion unit and the charge transfer impedance, and sending the control signal to the voltage conversion unit according to the charging and discharging frequency and the safe amplitude current to cause the voltage conversion unit to perform boost or buck processing of the first voltage or the second voltage according to the control signal, the effect of heating of the battery is greatly improved and the efficiency of heating is increased.

Figure 14:
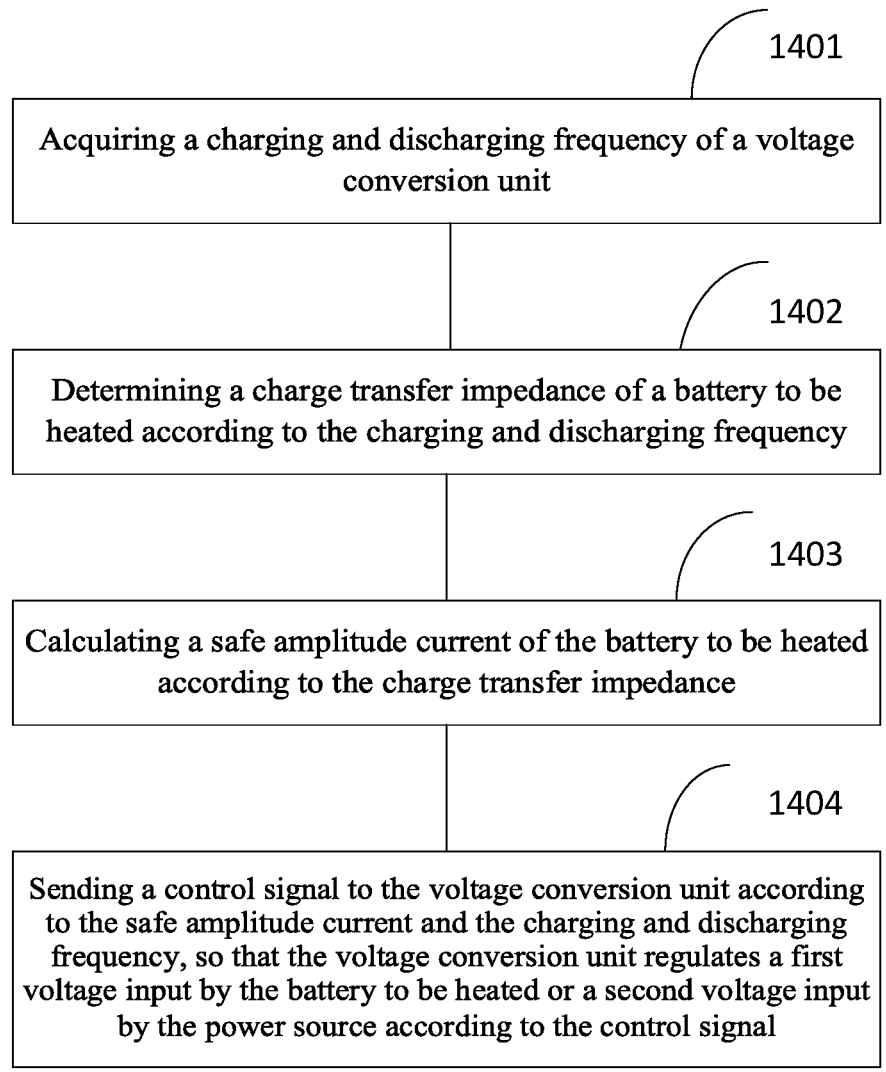
FIG. 14 illustrates a schematic diagram of the flow of a battery heating method proposed in embodiments of the present application.

Another aspect of embodiments of the present application provides a battery heating method applied to the battery heating system proposed in the above embodiments, which is specifically as shown in FIG. 14. The battery heating method proposed in embodiments of the present application comprises:

step 1401: acquiring a charging and discharging frequency of the voltage conversion unit;

step 1402: determining a charge transfer impedance of the battery to be heated 300 according to the charging and discharging frequency;

step 1403: calculating a safe amplitude current of the battery to be heated 300 according to the charge transfer impedance; and step 1404: sending a control signal to the voltage conversion unit according to the safe amplitude current and the charging and discharging frequency, so that the voltage conversion unit regulates a first voltage input by the battery to be heated 300 or a second voltage input by the power source 200 according to the control signal.

Here, the battery to be heated is electrically connected to the power source through the voltage conversion unit, and the power source is in various forms, which may be the high-voltage battery and the low-voltage battery in the electrical apparatus, or may be the power source provided after voltage conversion through the on board charger.

In the above embodiment of the present application, by determining the safe amplitude current according to the charging and discharging frequency of the voltage conversion unit and the charge transfer impedance, and sending the control signal to the voltage conversion unit according to the charging and discharging frequency and the safe amplitude current to cause the voltage conversion unit to perform boost or buck processing of the first voltage or the second voltage according to the control signal, the effect of heating of the battery is greatly improved and the efficiency of heating is increased.

In some embodiments, said determining the charge transfer impedance of the battery to be heated according to the charging and discharging frequency comprises: acquiring the temperature of the battery to be heated, and determining the charge transfer impedance of the battery to be heated according to the temperature and the charging and discharging frequency.

In this way, it is possible to monitor the state of the battery to be heated in real time and to correct the charging and discharging voltage, so that the battery to be heated is always in an optimal effect of heating, thus greatly improving the efficiency of heating.

In some embodiments, said determining the charge transfer impedance of the battery to be heated according to the charging and discharging frequency comprises: determining the charge transfer impedance of the battery to be heated according to the state of charge of the battery to be heated, the temperature, and the charging and discharging frequency; and said calculating a safe amplitude current of the battery to be heated according to the charge transfer impedance comprises: calculating the safe amplitude current of the battery to be heated according to a lithium plating potential of the battery to be heated and the charge transfer impedance.

In embodiments of the present application, the safe amplitude current is acquired according to the equilibrium potential of the graphite negative electrode and the charge transfer impedance without relying on the charging cut-off voltage and open-circuit voltage set by the manufacturer, which enables the true state of the battery to be charged to be reflected to the greatest extent and breaks through the limitation of the cut-off voltage set by the manufacturer, thus greatly improving the efficiency of heating.

In some embodiments, said calculating a safe amplitude current of the battery to be heated according to the charge transfer impedance comprises: pre-storing a state of charge of the battery to be heated, a temperature, a charging and discharging frequency, and a safe amplitude current mapping table; and determining a safe amplitude current of the battery to be heated in its current state by searching in the safe amplitude current mapping table according to the state of charge of the battery to be heated, the temperature, and the charging and discharging frequency.

By setting the mapping table of the state of charge, the temperature, the charging and discharging frequency, and the safe amplitude current for the battery to be heated, the safe amplitude current for charging and discharging can be quickly acquired, thus improving the efficiency of heating.

In some embodiments, said regulating a first voltage input by the battery to be heated or a second voltage input by the power source according to the control signal comprises: performing boost or buck processing of the first voltage or the second voltage in a first time period so that a charging current received by the battery to be heated is less than the safe amplitude current.

In some embodiments, said regulating a first voltage input by the battery to be heated or a second voltage input by the power source according to the control signal comprises: performing boost or buck processing of the first voltage or the second voltage in a second time period so that a discharging current output from the battery to be heated is less than the safe amplitude current.

In some embodiments, the method further comprises: regulating the first voltage input by the battery to be heated or the second voltage input by the power source when the temperature is less than a first preset threshold; and stopping regulating the first voltage input by the battery to be heated or the second voltage input by the power source when the temperature is greater than or equal to the first preset threshold.

In the above manner, by monitoring the temperature of the battery to be heated in real time, the heating process can be controlled in time according to the condition of the battery to be heated, and when the effect of heating is not good, the heating process can be terminated in time to save energy.

In some embodiments, the method further comprises: starting an external heating source to heat the battery to be heated when the temperature is less than a second preset threshold; and turning off the external heating source when the temperature is greater than or equal to the second preset threshold, the first preset threshold being less than the second preset threshold.

In embodiments of the present application, by combining the rapid heating mode with a mode of heating with a conventional external heating source, the effect of heating the battery to be heated is improved and the efficiency of heating is increased.

Another aspect of embodiments of the present application further proposes a power supply system, comprising the battery heating system proposed in the above embodiments, wherein the battery heating system is used for heating a battery to be heated, and the battery to be heated is used for providing a power source.

Another aspect of embodiments of the present application further proposes an electrical apparatus, comprising the power supply system described above, wherein the power supply system is used for providing a power source. The electrical apparatus may be, but is not limited to, a mobile phone, a tablet, a laptop, an electric toy, an electric tool, a battery vehicle, an electric vehicle, a ship, a spacecraft, and so on. Among them, the electric toy may include a stationary or mobile electric toy, for example, a game console, an electric car toy, an electric ship toy, and an electric aircraft toy, and the like, and the spacecraft may include an aircraft, a rocket, a space shuttle and a spaceship, and the like.

Finally, it should be noted that the above embodiments are used only to illustrate, instead of limiting, the technical solutions of the present application; although the present application is described in detail with reference to the preceding embodiments, it should be understood by those of ordinary skill in the art that: it is still possible to modify the technical solutions recorded in the preceding embodiments, or to equivalently replace some of the technical features therein; and these modifications or replacements do not make the essence of the corresponding technical solutions depart from the spirit and scope of the technical solutions of the embodiments of the present application.

What is claimed is:

1. A battery heating system, comprising:
a voltage conversion unit configured to be electrically connected to a power source and to a battery to be heated, to receive a first voltage input by the power source or a second voltage input by the battery to be heated, a charging and discharging frequency of the voltage conversion unit being a maximum switching frequency of the voltage conversion unit; and
a control unit for acquiring the charging and discharging frequency of the voltage conversion unit, determining a charge transfer impedance of the battery to be heated according to the charging and discharging frequency, calculating a safe amplitude current of the battery to be heated according to the charge transfer impedance, and sending a control signal to the voltage conversion unit according to the charging and discharging frequency and the safe amplitude current to cause the voltage conversion unit to perform boost or buck processing of the first voltage or the second voltage according to the control signal.

2. The battery heating system according to claim 1, further comprising:
a temperature monitoring unit;
wherein:
the temperature monitoring unit is configured to monitor a temperature of the battery to be heated and send the temperature to the control unit; and
the control unit determines the charge transfer impedance of the battery to be heated according to the temperature and the charging and discharging frequency of the voltage conversion unit.

3. The battery heating system according to claim 2, wherein the control unit is further configured to:
determine the charge transfer impedance of the battery to be heated according to a state of charge of the battery to be heated, the temperature, and the charging and discharging frequency; and
calculate the safe amplitude current of the battery to be heated according to a lithium plating potential of the battery to be heated and the charge transfer impedance.

4. The battery heating system according to claim 2, wherein:
the control unit pre-stores a mapping table mapping a state of charge of the battery to be heated, a temperature, a charging and discharging frequency, and a safe amplitude current; and
the control unit is further configured to determine the safe amplitude current of the battery to be heated in its current state by searching in the mapping table according to the state of charge of the battery to be heated, the temperature, and the charging and discharging frequency.

5. The battery heating system according to claim 2, wherein the control unit is further configured to:
send a control signal to the voltage conversion unit in response to the temperature being less than a first preset threshold; and
stop outputting the control signal in response to the temperature being greater than or equal to the first preset threshold.

6. The battery heating system according to claim 5, further comprising:
an external heating source;
wherein the control unit is further configured to:
start the external heating source to heat the battery to be heated in response to the temperature being less than a second preset threshold; and
turn off the external heating source in response to the temperature being greater than or equal to the second preset threshold, the first preset threshold being less than the second preset threshold.

7. The battery heating system according to claim 1, wherein the voltage conversion unit is further configured to perform boost or buck processing of the first voltage or the second voltage in a time period so that a charging current received by the battery to be heated is less than the safe amplitude current.

8. The battery heating system according to claim 1, wherein the voltage conversion unit is further configured to perform boost or buck processing of the first voltage or the second voltage in a time period so that a discharging current output from the battery to be heated is less than the safe amplitude current.

9. A battery heating method for a battery to be heated that is electrically connected to a power source through a voltage conversion unit, the method comprising:
    acquiring a charging and discharging frequency of the voltage conversion unit, the charging and discharging frequency of the voltage conversion unit being a maximum switching frequency of the voltage conversion unit;
    determining a charge transfer impedance of the battery to be heated according to the charging and discharging frequency;
    calculating a safe amplitude current of the battery to be heated according to the charge transfer impedance; and
    sending a control signal to the voltage conversion unit according to the safe amplitude current and the charging and discharging frequency, so that the voltage conversion unit regulates a first voltage input by the battery to be heated or a second voltage input by the power source according to the control signal.

10. The battery heating method according to claim 9, wherein determining the charge transfer impedance of the battery to be heated according to the charging and discharging frequency comprises:
    acquiring a temperature of the battery to be heated, and determining the charge transfer impedance of the battery to be heated according to the temperature and the charging and discharging frequency.

11. The battery heating method according to claim 10, wherein:
    determining the charge transfer impedance of the battery to be heated according to the charging and discharging frequency comprises determining the charge transfer impedance of the battery to be heated according to a state of charge of the battery to be heated, the temperature, and the charging and discharging frequency; and
    calculating the safe amplitude current of the battery to be heated according to the charge transfer impedance comprises calculating the safe amplitude current of the battery to be heated according to a lithium plating potential of the battery to be heated and the charge transfer impedance.

12. The battery heating method according to claim 10, wherein calculating the safe amplitude current of the battery to be heated according to the charge transfer impedance comprises:
    pre-storing a mapping table mapping a state of charge of the battery to be heated, a temperature, a charging and discharging frequency, and a safe amplitude current; and
    determining the safe amplitude current of the battery to be heated in its current state by searching in the mapping table according to the state of charge of the battery to be heated, the temperature, and the charging and discharging frequency.

13. The battery heating method according to claim 9, wherein regulating the first voltage input by the battery to be heated or the second voltage input by the power source according to the control signal comprises:
    performing boost or buck processing of the first voltage or the second voltage in a time period so that a charging current received by the battery to be heated is less than the safe amplitude current.

14. The battery heating method according to claim 9, wherein regulating the first voltage input by the battery to be heated or the second voltage input by the power source according to the control signal comprises:
    performing boost or buck processing of the first voltage or the second voltage in a time period so that a discharging current output from the battery to be heated is less than the safe amplitude current.

15. The battery heating method according to claim 9, further comprising:
    regulating the first voltage input by the battery to be heated or the second voltage input by the power source in response to the temperature being less than a first preset threshold; and
    stopping regulating the first voltage input by the battery to be heated or the second voltage input by the power source in response to the temperature being greater than or equal to the first preset threshold.

16. The battery heating method according to claim 15, further comprising:
    starting an external heating source to heat the battery to be heated in response to the temperature being less than a second preset threshold; and
    turning off the external heating source in response to the temperature being greater than or equal to the second preset threshold, the first preset threshold being less than the second preset threshold.

17. A power supply system, comprising:
    a battery heating system for heating a battery to be heated and comprising:
        a voltage conversion unit configured to be electrically connected to a power source and to the battery to be heated, to receive a first voltage input by the power source or a second voltage input by the battery to be heated, a charging and discharging frequency of the voltage conversion unit being a maximum switching frequency of the voltage conversion unit; and
        a control unit for acquiring the charging and discharging frequency of the voltage conversion unit, determining a charge transfer impedance of the battery to be heated according to the charging and discharging frequency, calculating a safe amplitude current of the battery to be heated according to the charge transfer impedance, and sending a control signal to the voltage conversion unit according to the charging and discharging frequency and the safe amplitude current to cause the voltage conversion unit to perform boost or buck processing of the first voltage or the second voltage according to the control signal;
    wherein the battery to be heated is used for providing power.

18. An electrical apparatus, comprising the power supply system of claim 17, wherein the power supply system is used for providing power.

* * * * *